(12) United States Patent
Zhang et al.

(10) Patent No.: US 12,176,687 B2
(45) Date of Patent: Dec. 24, 2024

(54) POWER CONVERTER

(71) Applicant: Hamilton Sundstrand Corporation, Charlotte, NC (US)

(72) Inventors: Chi Zhang, Hangzhou (CN); Jeffrey Ewanchuk, Manchester, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 219 days.

(21) Appl. No.: 17/750,934

(22) Filed: May 23, 2022

(65) Prior Publication Data

US 2023/0378724 A1 Nov. 23, 2023

(51) Int. Cl.
| | |
|---|---|
| *H05K 1/02* | (2006.01) |
| *B33Y 80/00* | (2015.01) |
| *H01L 23/36* | (2006.01) |
| *H02B 1/04* | (2006.01) |
| *H02B 1/20* | (2006.01) |

(52) U.S. Cl.
CPC ............... *H02B 1/04* (2013.01); *B33Y 80/00* (2014.12); *H01L 23/36* (2013.01); *H02B 1/20* (2013.01); *H05K 1/0213* (2013.01)

(58) Field of Classification Search
None
See application file for complete search history.

(56) References Cited

U.S. PATENT DOCUMENTS

| | | | |
|---|---|---|---|
| 5,631,497 A * | 5/1997 | Miyano | ................... H01L 25/50 |
| | | | 257/E21.705 |
| 8,716,870 B2 | 5/2014 | Gowda | |
| 8,952,525 B2 | 2/2015 | Ide et al. | |
| 9,966,345 B1 * | 5/2018 | Sizikov | ............. H01L 23/49822 |
| 10,497,642 B2 | 12/2019 | Mao et al. | |
| 10,498,116 B2 | 12/2019 | Pal et al. | |
| 10,736,236 B2 | 4/2020 | Engelhardt et al. | |
| 10,881,037 B2 | 12/2020 | Jenkins et al. | |
| 11,211,317 B2 | 12/2021 | Tuominen | |
| 11,798,897 B2 * | 10/2023 | Yeh | ..................... H01L 21/4871 |
| 2007/0146941 A1 * | 6/2007 | Harris | .................. H05K 1/0257 |
| | | | 361/18 |
| 2009/0086436 A1 | 4/2009 | Kluge | |

(Continued)

FOREIGN PATENT DOCUMENTS

| | | |
|---|---|---|
| DE | 102008034075 A1 | 4/2010 |
| EP | 3326986 A1 | 5/2018 |

(Continued)

OTHER PUBLICATIONS

Extended Search Report Issued Oct. 24, 2023; 9 pages.

*Primary Examiner* — Courtney L Smith
(74) *Attorney, Agent, or Firm* — CANTOR COLBURN LLP (57) ABSTRACT

A power converter includes a field graded substrate, a plurality of power device dies attached to the field graded substrate, a polymer layer on the field graded substrate, one or more conductors over the polymer layer, and a plurality of power conditioning components mounted on the field graded substrate to form a power converter circuit. The field graded substrate includes a first conductor layer, a graded layer that blends conductor and insulator material, and a second conductor layer, the graded layer having an insulator core.

18 Claims, 4 Drawing Sheets

(56) References Cited

U.S. PATENT DOCUMENTS

| | | | |
|---|---|---|---|
| 2013/0042963 A1* | 2/2013 | Lim | H05K 1/0203 |
| | | | 156/60 |
| 2019/0110366 A1 | 4/2019 | Gavagnin et al. | |
| 2019/0207304 A1* | 7/2019 | Kim | H01L 24/25 |
| 2021/0175146 A1 | 6/2021 | Reznik | |
| 2023/0187830 A1* | 6/2023 | Lee | H01Q 1/22 |
| | | | 343/700 MS |
| 2023/0378888 A1* | 11/2023 | Kist | H05K 1/162 |

FOREIGN PATENT DOCUMENTS

| | | |
|---|---|---|
| WO | 2020021197 A1 | 1/2020 |
| WO | 2020225500 A2 | 11/2020 |

\* cited by examiner

POWER CONVERTER

BACKGROUND

The present invention generally relates to power converters, and more specifically, to power converters made with additive manufacturing processes.

Power converters are used for a variety of applications and may include converting alternating current (AC) to direct current (DC), converting AC to AC, DC to AC, and/or DC to DC. Power converters are typically assembled together from a variety of components with a mixture of custom and off-the-shelf parts. The compactness of power converters can be compromised due to the need to balance the ease of assembly in the state of the art. The ability to enhance the power density of power converters can become increasingly limited due to the need to mechanically fasten each component together in some fashion, i.e., through connectors or thermal interface materials.

In a highly-integrated power converter, components are typically assembled first on a substrate, i.e., a printed circuit board (PCB), and then each of the substrates are interconnected to form a final assembly. However, a limitation in this approach is that each substrate typically cannot easily interconnect with another substrate, and hence, some interface material is required. This interface material typically reduces the thermal performance of the power converter and therefore limits the power density from increasing further.

BRIEF DESCRIPTION

Embodiments of the present invention are directed to a power converter that includes a field graded substrate, a plurality of power device dies attached to the field graded substrate, a polymer layer on the field graded substrate, one or more conductors over the polymer layer, and a plurality of power conditioning components mounted on the field graded substrate to form a power converter circuit. The field graded substrate includes a first conductor layer, a graded layer that blends conductor and insulator material, and a second conductor layer, the graded layer having an insulator core.

In addition to one or more of the features described above, or as an alternative, further embodiments may include where the graded layer includes a blend of copper and ceramic with a higher copper-to-ceramic ratio closer to the first conductor layer and the second conductor layer, the graded layer having a lower copper-to-ceramic ratio closer to the insulator core.

In addition to one or more of the features described above, or as an alternative, further embodiments may include where the power device dies are attached to the first conductor layer and a heat sink is integrally formed with the second conductor layer.

In addition to one or more of the features described above, or as an alternative, further embodiments may include where the heat sink includes a base plate and a plurality of cooling fins.

In addition to one or more of the features described above, or as an alternative, further embodiments may include where the base plate, the cooling fins, and the second conductor layer are made of a combination of copper and aluminum.

In addition to one or more of the features described above, or as an alternative, further embodiments may include where the power device dies include two or more printed circuit board embedded dies of power transistors.

In addition to one or more of the features described above, or as an alternative, further embodiments may include where the polymer layer is a printed polymer.

In addition to one or more of the features described above, or as an alternative, further embodiments may include where the polymer layer is an embedded lamination.

In addition to one or more of the features described above, or as an alternative, further embodiments may include where the one or more conductors are seeded on the polymer layer using titanium and/or copper sputtering with a copper deposition layer to provide a plurality of electrical interconnections.

In addition to one or more of the features described above, or as an alternative, further embodiments may include where the power conditioning components include one or more of: decoupling capacitors, shunt resistors, and electromagnetic interference filters.

Embodiments of the present invention are directed to a method of assembling a power converter. The method includes printing, by an additive manufacturing process, a field graded substrate having a first conductor layer, a graded layer that blends conductor and insulator material, and a second conductor layer, the graded layer having an insulator core. The method also includes attaching a plurality of power device dies to the field graded substrate, applying a polymer layer on the field graded substrate, depositing one or more conductors over the polymer layer, and mounting a plurality of power conditioning components on the field graded substrate to form a power converter circuit.

In addition to one or more of the features described above, or as an alternative, further embodiments may include where the power device dies are attached to the first conductor layer and the method can include printing, by another additive manufacturing process, a heat sink on the second conductor layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of electric power systems to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the disclosure, aspects of the present disclosure provide for a system and associated method for a highly-integrated power converter that utilizes a series of thermally and mechanically compatible additive manufacturing process steps to achieve a high power density.

Figure 1:
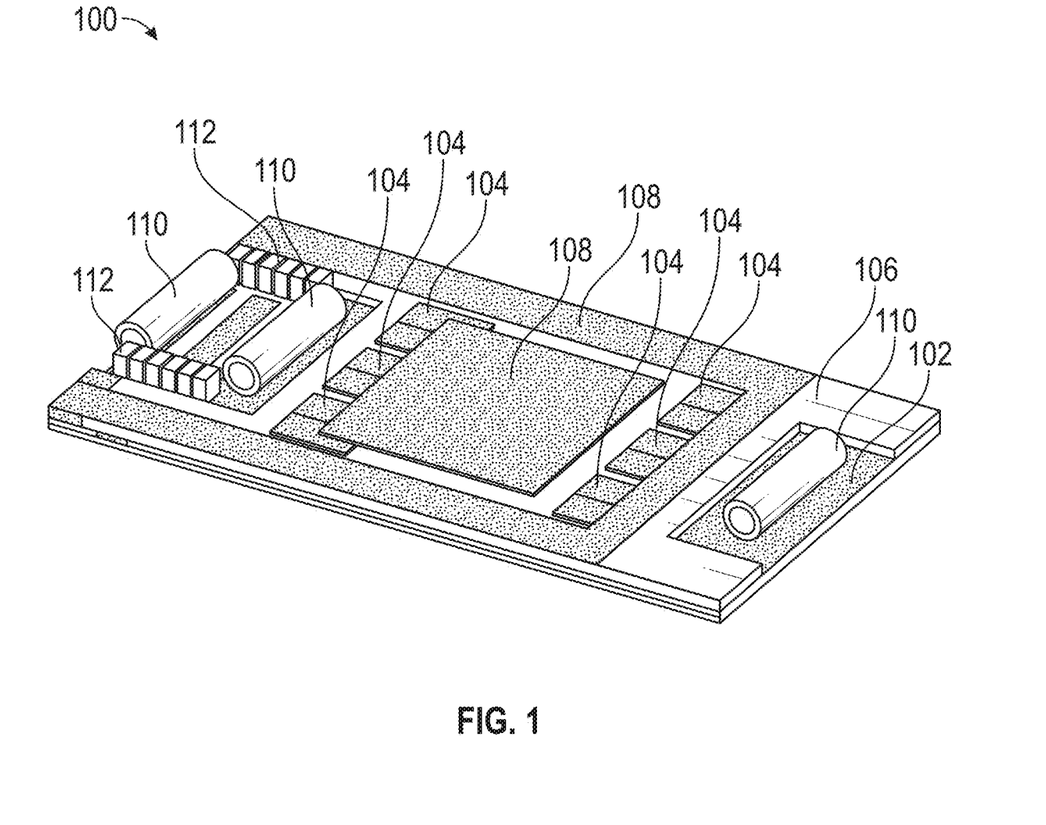
FIG. 1 is a perspective view of a power converter according to one or more embodiments.

FIG. 1 illustrates an example of a power converter 100 according to one or more embodiments. The power converter 100 can be formed at least in part using a plurality of additive manufacturing processes. The power converter 100 can include an additively manufactured field graded substrate 102 with a plurality of power device dies 104 attached to the field graded substrate 102. The power device dies 104 can include two or more printed circuit board embedded dies of power transistors, where the dies are packaged in a sub-assembly to increase their electrical pad area. For example, the power device dies 104 can be switches, such as power metal-oxide semiconductor field-effect transistors (MOSFETs), insulated gate bipolar transistors (IGBTs), or the like. A non-conductive polymer layer 106 can be applied on the field graded substrate 102, and one or more conductors 108 can be deposited over the polymer layer 106 using an additively manufactured process. The power converter 100 can also include a plurality of power conditioning components 110, 112 mounted on the field graded substrate 102 to form a power converter circuit. The power converter circuit can be a bi-directional AC/DC power converter, where the power conditioning components 110, 112 are configured to perform signal conditioning, filtering, and provide short-circuit protection, for example. The power conditioning components 110, 112 can include one or more of: decoupling capacitors, shunt resistors, and electromagnetic interference filters. Multiple instances of the power converter 100 can be combined in a power system. For example, in a 3-phase power application, each phase can have a separate instance of the power converter 100. When implemented as part of a power system, additional control and power distribution circuitry can be coupled to the power converter 100 to monitor and/or control power conversion, such as AC to DC or DC to AC conversion. The power converter 100 may be well suited to hybrid electric vehicle applications, specifically in aerospace electric motor applications demanding a high power density.

Figure 2:
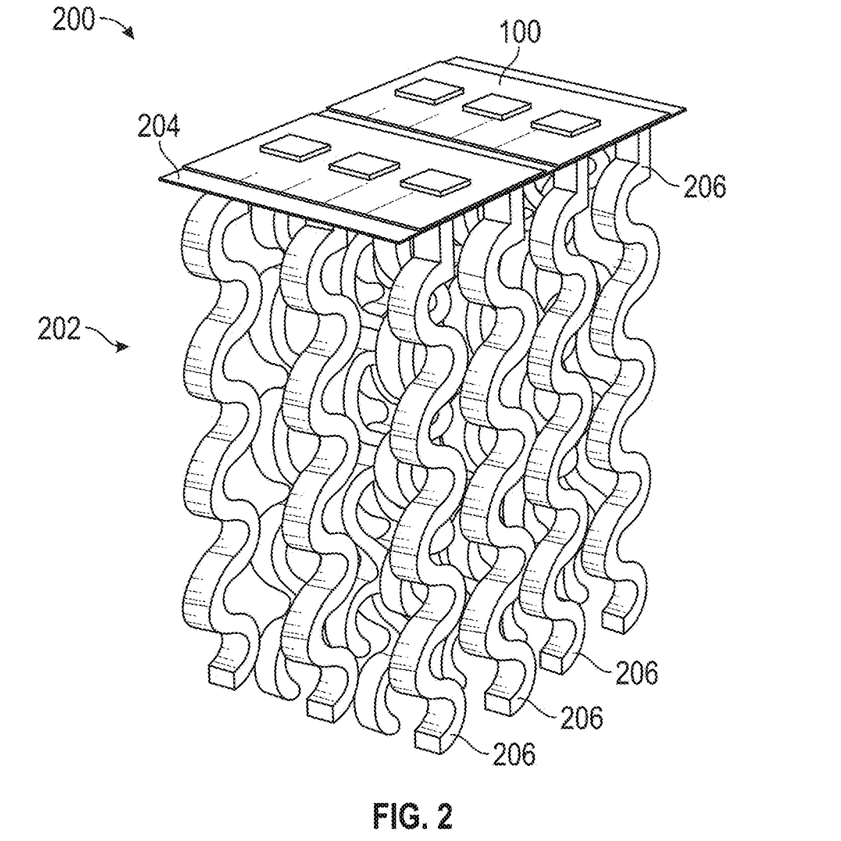
FIG. 2 is a perspective view of a power converter system with an integrated heat sink according to one or more embodiments.

FIG. 2 is a perspective view of a power converter system 200 with an integrated heat sink 202 according to one or more embodiments. The power converter system 200 can include the power converter 100 of FIG. 1 with the heat sink 202 coupled thereto. In embodiments, the heat sink 202 can be integrally formed with the power converter 100, for instance, by using an additive manufacturing process to print the heat sink 202 on the field graded substrate 102 (FIG. 1). The heat sink 202 can include a base plate 204 and a plurality of cooling fins 206. The base plate 204 can be integrally formed with the field graded substrate 102 (FIG. 1) and the cooling fins 206 can extend from a surface of the base plate 204. Using an additive manufacturing process to form the cooling fins 206 can allow for complex geometries to perform cooling with a reduced cooling volume as compared to straight/linear tube/pin type cooling fins. In some embodiments, the base plate 204, the cooling fins 206, and the second conductor layer 212 can be made of a combination of copper and aluminum.

Figure 3:
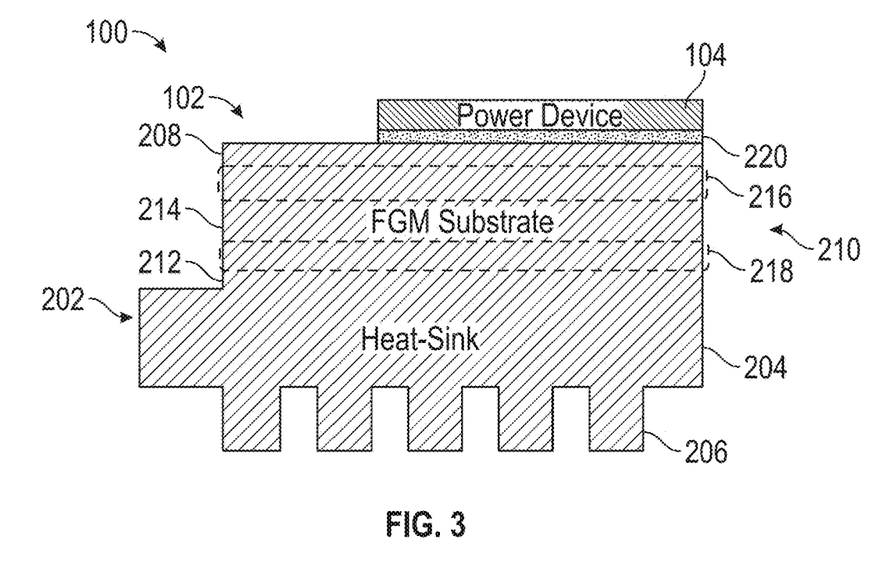
FIG. 3 is a partial side view of a power converter with an integrated heat sink according to one or more embodiments.

FIG. 3 is a partial side view of the power converter 100 with integrated heat sink 202 according to one or more embodiments. FIG. 3 illustrates that the field graded substrate 102 includes a first conductor layer 208, a graded layer 210 that blends conductor and insulator material, and a second conductor layer 212. The graded layer 210 has an insulator core 214. The graded layer 210 can include a blend of copper and ceramic with a higher copper-to-ceramic ratio in a first graded region 216 closer to the first conductor layer 208 and in a second graded region 218 closer to the second conductor layer 212. The graded layer 210 can also include a lower copper-to-ceramic ratio in portions of the first graded region 216 and the second graded region 218 closer to the insulator core 214. The tapering or blending of materials having different conductivity characteristics in the first graded region 216 and the second graded region 218 results in a reduction in mechanical and electrical stress that may result from thermal expansion and/or electric field manipulation. The blending of materials can be achieved through additive manufacturing processes that control blending of powder ratios used as the layers of the field graded substrate 102 are constructed from the second conductor layer 212 to the second graded region 218 to the insulator core 214 to the first graded region 216 to the first conductor layer 208. The first graded region 216 and the second graded region 218 may include other materials in the blend, such as copper alloy.

The additive manufacturing processes can use any known technique, such as powder bed fusion to create printed workpieces from metal, ceramic, polymer, and composite powder materials. These processes induce fusion of particles by exposing them to one or more thermal sources, which are generally laser or electron beam sources. Approaches for fusion in the liquid phase can include full melting, liquid-phase sintering, and indirect fusion. Metal, ceramic, and polymer materials capable of being melted and resolidified can be used for these approaches. With full melting, particles can be fused by fully melting them with a high-power laser or electron beam. Liquid-phase sintering can use a mixture of two or more metal powders or metal alloy, in which the thermal source melts a lower-melting-temperature constituent, but a higher-melting-temperature constituent remains solid. The lower "melting" temperature constituent is sometimes referred to as a binder particle and the higher melting temperature constituent as a structural particle. An example of indirect fusion is a powder material comprising structural particles (e.g., a metal) coated with a binder (e.g., a polymer). Exposure to the thermal source melts the binder, thus inducing fusion, while the structural particle remains solid. Various aspects of process control may be managed during powder bed fusion. These include laser-related parameters (e.g., laser power, spot size, pulse duration and frequency); scan-related parameters (e.g., scan pattern, speed and spacing); powder-related parameters (e.g., particle shape, size and distribution, powder bed density, layer thickness, material properties, and uniform powder deposition); and temperature related parameters (powder bed temperature, powder material supply temperature, temperature uniformity, and temperature monitoring).

The base plate 204 of heat sink 202 can be directly printed, through an additive manufacturing process, on the second conductor layer 212 of the field graded substrate 102. The cooling fins 206 can be printed on a surface of the base plate 204, e.g., on a lower surface opposite the second conductor layer 212. Power devices, such as the power device dies 104 can be bonded with the first conductor layer 208 of the field graded substrate 102 using solder 220 or other such bonding techniques to establish physical and electric connections at the desired locations. The power device dies 104 can be attached prior to integrating the field graded substrate 102 with the heat sink 202 or the power device dies 104 can be attached after integrating the field graded substrate 102 with the heat sink 202.

Figure 4:
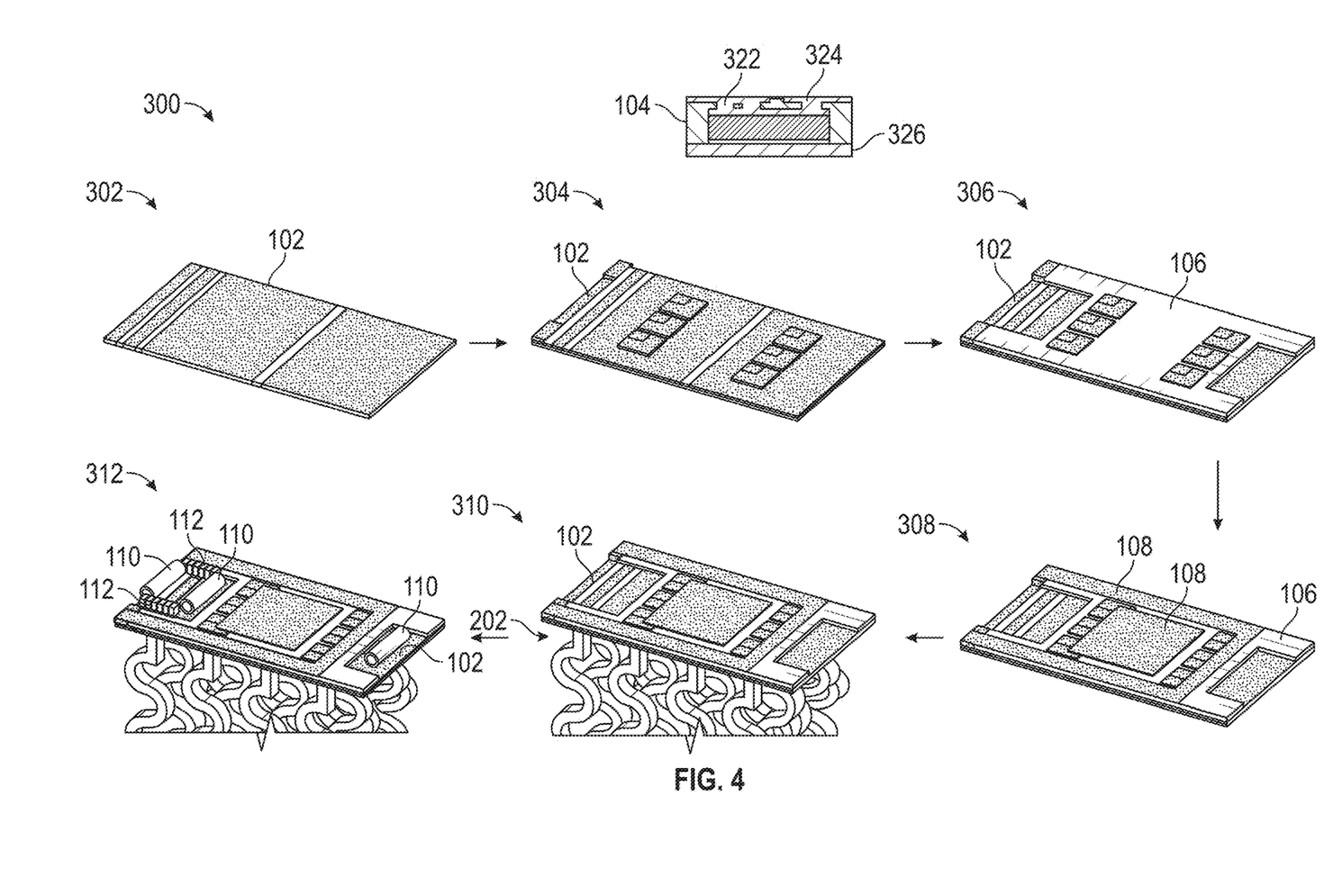
FIG. 4 depicts a manufacturing sequence for producing a power converter with an integrated heat sink according to one or more embodiments.
Figure 5:
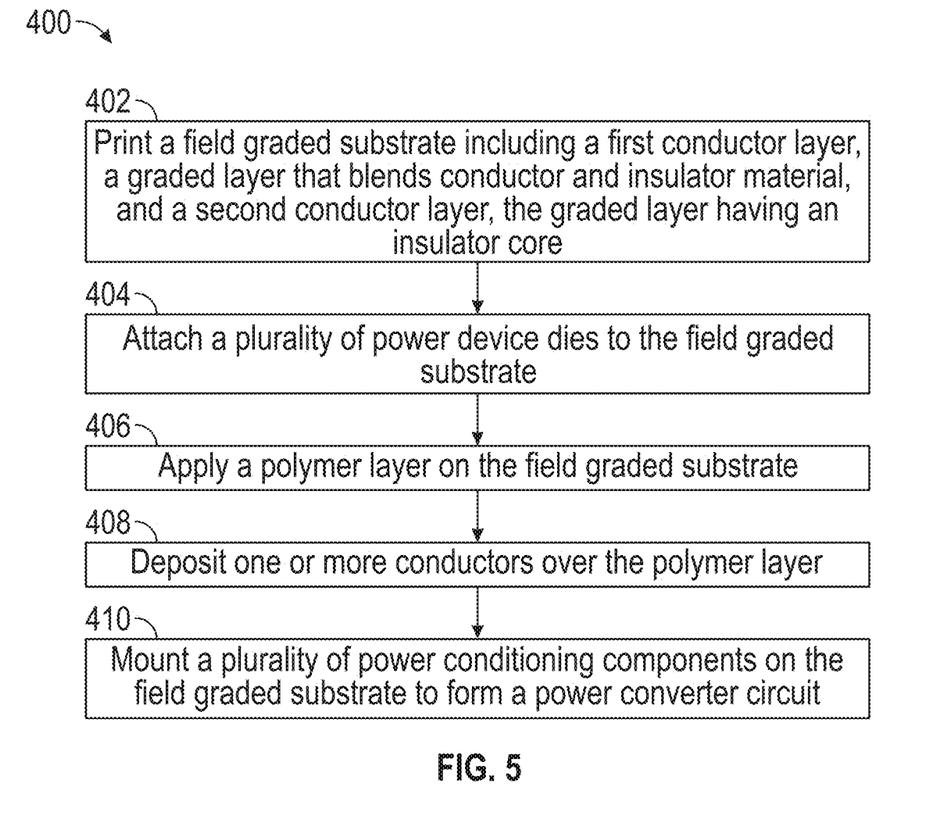
FIG. 5 depicts a method of producing a power converter according to one or more embodiments.

FIG. 4 depicts a manufacturing sequence 300 for producing the power converter 100 with integrated heat sink 202 according to one or more embodiments. FIG. 5 depicts a process 400 of producing the power converter 100 and is described in combination with the manufacturing sequence 300 and with reference to FIGS. 1-3 for further illustration.

At step 302 and block 402, an additive manufacturing process can be used to print a field graded substrate 102, where the field graded substrate 102 includes a first conductor layer 208, a graded layer 210 that blends conductor and insulator material, and a second conductor layer 212. The graded layer 210 has an insulator core 214. The field graded substrate 102 can be synthesized first by using ceramic and metallic powders bonded together by a sintering process.

At step 304 and block 404, a plurality of power device dies 104 can be attached to the field graded substrate 102. The power device dies 104 can be attached to the first conductor layer 208 of the field graded substrate 102. The power device dies 104 can be formed as wide band gap semiconductor devices with small pad sizes that may pose limitations for some processes which aim to interconnect with the pads. Using a sub-assembly around the power device can enlarge the pad sizes and encapsulate the core component in an otherwise isolating material, e.g., a glass-reinforced epoxy laminate material. In the example of FIG. 4, each of the power device dies 104 can include a source 322, gate 324, and drain 326, where the drain 326 can be coupled to the field graded substrate 102. The power device dies 104 embodied as prepackaged devices can be bonded to the field graded substrate 102 using solder 220 or other such techniques.

At step 306 and block 406, a polymer layer 106 can be applied on the field graded substrate 102. The polymer layer 106 can be a printed polymer or an embedded lamination. For example, an ultraviolet (UV) resin or another type of polymer printing material can use the field graded substrate 102 as a basis to print a polymer pattern according to a specific design and layout.

At step 308 and block 408, one or more conductors 108 can be deposited over the polymer layer 106. Titanium and/or copper sputtering can be used to seed a conductive layer (e.g., a copper deposition layer) on the polymer layer 106. Copper deposition can be used to thicken the copper in order to provide electrical interconnections for the power converter 100.

At step 310, a heat sink 202 made of metal can be directly printed on the bottom side (second conductor layer 212) of the field graded substrate 102. This can be performed at least in part due to the thicker conductor thickness enabled by the field grading of the field graded substrate 102. The heat sink 202 can be printed using another additive manufacturing process, such as selective laser melting with aluminum. The cooling fins 206 may have a thickness of about 1 mm to about 2 mm. The addition of the heat sink 202 can be optional and may be a further step included in the process 400.

At step 312 and block 410, a plurality of power conditioning components 110, 112 can be mounted on the field graded substrate 102 to form a power converter circuit. The power conditioning components 110, 112 can be assembled on the power converter 100 and an oven can be used for soldered components. In some embodiments, spring connectors can be used for gate driver and power distribution boards. Spring connectors can be formed from an electrically conductive material, such as copper or a copper beryllium material, and may further be plated or otherwise coated to provide corrosion resistance. Use of spring connectors can increase electrical conduction area, which reduces the voltage drop and increases thermal conduction area.

The field grading design of the field graded substrate 102 may be enabled by using a powder based additive manufacturing process, and is able to benefit from reduction of thermoelectric and thermo-mechanical stress. The process can also enable thicker conductor layers, e.g., on the bottom, and thinner ceramic layers due to the reduced mechanical stress and peak electric fields. The thinner ceramic layer enables a lower thermal resistance within the substrate due to reduced thermal conductivity of the material as compared to the conductors. Prior technology for power converters typically involved creating separate components and then mechanically binding them together to create lower thermal and electrical resistances required for the converter function. Even in the highest level of integrated converters, interface materials may need some external pressure in order for the entire assembly to function correctly. Where the power converter 100 is built around the field graded substrate 102 with successive additive manufacturing steps, in no step for the power converter 100 is a force required between an interconnection and the heat sink 202 to create a bond. Therefore, reliability is enhanced, the thermal resistances are improved, and the number of discrete interface layers is reduced to enable a highly integrated converter.

While the above description has described FIGS. 4-5 in a particular order, it should be appreciated that unless otherwise specifically required in the attached claims that the ordering of the steps may be varied, and steps may be added, removed, combined, or further subdivided.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A power converter comprising:
   a field graded substrate comprising a first conductor layer, a graded layer that blends conductor and insulator material, and a second conductor layer, the graded layer having an insulator core;
   a plurality of power device dies attached to the field graded substrate;
   a polymer layer on the field graded substrate;
   one or more conductors over the polymer layer; and
   a plurality of power conditioning components mounted on the field graded substrate to form a power converter circuit;
   wherein the graded layer comprises a blend of copper and ceramic with a higher copper-to-ceramic ratio closer to the first conductor layer and the second conductor layer, the graded layer comprising a lower copper-to-ceramic ratio closer to the insulator core.

2. The power converter of claim 1, wherein the power device dies are attached to the first conductor layer and a heat sink is integrally formed with the second conductor layer.

3. The power converter of claim 2, wherein the heat sink comprises a base plate and a plurality of cooling fins.

4. The power converter of claim 3, wherein the base plate, the cooling fins, and the second conductor layer are made of a combination of copper and aluminum.

5. The power converter of claim 1, wherein the power device dies comprise two or more printed circuit board embedded dies of power transistors.

6. The power converter of claim 1, wherein the polymer layer is a printed polymer.

7. The power converter of claim 1, wherein the polymer layer is an embedded lamination.

8. The power converter of claim 1, wherein the one or more conductors are seeded on the polymer layer using titanium and/or copper sputtering with a copper deposition layer to provide a plurality of electrical interconnections.

9. The power converter of claim 1, wherein the power conditioning components comprise one or more of: decoupling capacitors, shunt resistors, and electromagnetic interference filters.

10. A method of assembling a power converter, the method comprising:
    printing, by an additive manufacturing process, a field graded substrate comprising a first conductor layer, a graded layer that blends conductor and insulator material, and a second conductor layer, the graded layer having an insulator core;
    attaching a plurality of power device dies to the field graded substrate;
    applying a polymer layer on the field graded substrate;
    depositing one or more conductors over the polymer layer; and
    mounting a plurality of power conditioning components on the field graded substrate to form a power converter circuit;
    wherein the graded layer comprises a blend of copper and ceramic with a higher copper-to-ceramic ratio closer to the first conductor layer and the second conductor layer, the graded layer comprising a lower copper-to-ceramic ratio closer to the insulator core.

11. The method of claim 10, wherein the power device dies are attached to the first conductor layer, and further comprising:
    printing, by another additive manufacturing process, a heat sink on the second conductor layer.

12. The method of claim 11, wherein the heat sink comprises a base plate and a plurality of cooling fins.

13. The method of claim 12, wherein the base plate, the cooling fins, and the second conductor layer are made of a combination of copper and aluminum.

14. The method of claim 10, wherein the power device dies comprise two or more printed circuit board embedded dies of power transistors.

15. The method of claim 10, wherein the polymer layer is a printed polymer.

16. The method of claim 10, wherein the polymer layer is an embedded lamination.

17. The method of claim 10, wherein the one or more conductors are seeded on the polymer layer using titanium and/or copper sputtering with a copper deposition layer to provide a plurality of electrical interconnections.

18. The method of claim 10, wherein the power conditioning components comprise one or more of: decoupling capacitors, shunt resistors, and electromagnetic interference filters.

\* \* \* \* \*